(12) United States Patent
Tian et al.

(10) Patent No.: US 10,607,534 B2
(45) Date of Patent: Mar. 31, 2020

(54) OLED PIXEL ARRANGEMENT STRUCTURE HAVING SUB-PIXELS OF DIFFERENT COLORS ALTERNATELY ARRANGED IN ADJACENT ROWS AND DISPLAY PANEL INCLUDING SAME

(71) Applicant: Wuhan China Star Optoelectronics Semiconductor Display Technology Co., Ltd., Wuhan, Hubei (CN)

(72) Inventors: Nian Tian, Guangdong (CN); Liang Sun, Guangdong (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/101,110

(22) Filed: Aug. 10, 2018

(65) Prior Publication Data

US 2019/0206310 A1    Jul. 4, 2019

Related U.S. Application Data

(63) Continuation of application No. PCT/CN2018/082572, filed on Apr. 10, 2018.

(30) Foreign Application Priority Data

Dec. 29, 2017  (CN) .......................... 2017 1 1472773

(51) Int. Cl.
*G09G 3/30* (2006.01)
*G09G 3/3208* (2016.01)
(Continued)

(52) U.S. Cl.
CPC ......... *G09G 3/3208* (2013.01); *G09G 3/2003* (2013.01); *H01L 27/32* (2013.01);
(Continued)

(58) Field of Classification Search
CPC .................................................. G09G 3/12–14
See application file for complete search history.

(56) References Cited

U.S. PATENT DOCUMENTS

| 2015/0379924 | A1* | 12/2015 | Matsueda | G09G 3/3208 345/690 |
| 2016/0335937 | A1* | 11/2016 | Lee | G09G 3/3233 |
| 2017/0039923 | A1* | 2/2017 | Feng | G09G 3/2003 |

FOREIGN PATENT DOCUMENTS

| CN | 103745684 A | 4/2014 |
| CN | 104332486 A | 2/2015 |

(Continued)

OTHER PUBLICATIONS

International Search Report in Application No. PCT/CN2018/082572, 9PP.

*Primary Examiner* — Sanghyuk Park
(74) *Attorney, Agent, or Firm* — Leong C. Lei

(57) ABSTRACT

The invention provides an OLED pixel arrangement structure and display panel, and the OLED pixel arrangement structure comprises: a first sub-pixel group, a second sub-pixel group, and a third sub-pixel; the n-th row of the OLED pixel arrangement structure comprising alternating arrangement of the first sub-pixel group and the second sub-pixel group at intervals; the (n+1)th row comprising a plurality of third sub-pixels arranged at intervals, and the third sub-pixel being disposed at the intervals between the first sub-pixel group and the second sub-pixel group. The structure improves the resolution of the OLED pixel arrangement structure and reduces the manufacturing difficulty.

18 Claims, 13 Drawing Sheets

(51) Int. Cl.
*H01L 27/32* (2006.01)
*G09G 3/20* (2006.01)

(52) U.S. Cl.
CPC ...... *H01L 27/3216* (2013.01); *H01L 27/3218* (2013.01); *G09G 2300/0452* (2013.01)

(56) References Cited

FOREIGN PATENT DOCUMENTS

| CN | 104465714 A | 3/2015 |
| CN | 105552099 A | 5/2016 |

* cited by examiner

OLED PIXEL ARRANGEMENT STRUCTURE HAVING SUB-PIXELS OF DIFFERENT COLORS ALTERNATELY ARRANGED IN ADJACENT ROWS AND DISPLAY PANEL INCLUDING SAME

CROSS REFERENCE TO RELATED APPLICATIONS

This application is a continuing application of PCT Patent Application No. PCT/CN2018/082572, entitled "OLED PIXEL ARRANGEMENT STRUCTURE AND DISPLAY PANEL", filed on Apr. 10, 2018, which claims priority to Chinese Patent Application No. 201711472773.X, filed on Dec. 29, 2017, both of which are hereby incorporated in its entireties by reference.

BACKGROUND OF THE INVENTION

1. Field of the Invention

The present invention relates to the field of display, and in particular to the field of organic light-emitting diode (OLED) pixel arrangement structure and display panel.

2. The Related Arts

In the panel display technology, organic light-emitting diode (OLED) displays have many advantages, such as, lightness, thinness, active light emission, fast response speed, large viewing angle, wide color gamut, high brightness, and low power consumption, and become the third-generation display technology after the LCD. At present, the market is increasingly demanding the display details, that is, the resolution, but the production of high-quality, high-resolution OLED displays still faces many challenges. The promising flexible displays is also favored by more manufacturers. Therefore, the luminous quality of the flexible OLED display has become an important research and development hotspot.

Recently, smart phones and other products on the market have increasingly high requirements for displays, with the highest resolution reaching 400 ppi. This poses a huge challenge to the current production technology of displays. Fine metal masks (FMM) is also one of the most critical technologies restricting the development of high-resolution OLEDs. With the increase of resolution requirements; the production of FMM becomes more and more difficult. At present, the main format is to arrange the sub-pixels of different colors spaced apart; and such sub-pixel arrangement structure can easily cause aliasing of adjacent colors when the pigments are vapor-deposited. Accordingly, a minimum limit is imposed on the distance between FMM openings of different color sub-pixels, which restricts the further improvement of the resolution.

SUMMARY OF THE INVENTION

The primary object of the present invention is to provide an OLED pixel arrangement structure, able to improve the resolution under the same manufacturing process or reduce the manufacturing process difficulty under the same resolution requirement. The specific technical solution is as follows:

an organic light emitting diode (OLED) pixel arrangement structure, which comprises a first sub-pixel group, a second sub-pixel group, and a third sub-pixel; the n-th row of the OLED pixel arrangement structure comprising alternating arrangement of the first sub-pixel group and the second sub-pixel group at intervals; the (n+1)th row comprising a plurality of third sub-pixels arranged at intervals, and the third sub-pixel being disposed at the intervals between the first sub-pixel group and the second sub-pixel group, n being a positive integer.

Colors of the sub-pixels pf the first sub-pixel group, the sub-pixels of the second sub-pixel group and the third sub-pixel are different.

Preferably; the first sub-pixel group comprises two first sub-pixels.

Preferably, the two first sub-pixels are arranged in a manner of upper-lower, left-right or diagonal positions in the first sub-pixel group.

Preferably, the second sub-pixel group comprises two second sub-pixels.

Preferably, the two second sub-pixels are arranged in a manner of upper-lower, left-right or diagonal positions in the second sub-pixel group.

Preferably, the first sub-pixel group in the n-th row and m-th column, the second sub-pixel group in the n-th row and (m+2)th column, the second sub-pixel group in the (n+2)th row and the m-th column, and first sub-pixel group in the (n+2)th row and (m+2)th column form a quadrilateral and center of the quadrilateral overlaps with center of the third sub-pixel in the (n+1)th row and (m+1)th column, and m is positive integer.

Preferably, distance between adjacent first sub-pixel group and second subpixel group in the n-th row is greater than or equal to width of a third sub-pixel, and distance between two adjacent third sub-pixels in the (n+1)th row is greater than or equal to width of one first sub-pixel group or one second sub-pixel group.

Preferably, the m-th column of the OLED pixel arrangement structure comprises alternating arrangement of the first sub-pixel group and the second sub-pixel group at intervals; the (m+1)th column comprises a plurality of third sub-pixels arranged at intervals, wherein distance between adjacent first sub-pixel group and second sub-pixel group in the m-th column is greater than or equal to height of a third sub-pixel, and distance between two adjacent third sub-pixels in the (m+1)th column is greater than or equal to the height of one first sub-pixel group or one second sub-pixel group, and m is a positive integer.

Preferably, distance between the first sub-pixel group in the n-th row and m-th column and the third sub-pixel in the (n+1)th row and (m+1)th column in a first direction is defined as a first distance, distance between the second sub-pixel group in the n-th row and (m+2)th column and the third sub-pixel in the (n+1)th row and (m+1)th column in the first direction is defined as a second distance, and the first distance is equal to the second distance.

Preferably, distance between the first sub-pixel group in the n-th row and m-th column and the third sub-pixel in the (n+1)th row and (m+1)th column in a second direction is defined as a third distance, distance between the second sub-pixel group in the (n+2)th row and m-th column and the third sub-pixel in the (n+1)th row and (m+1)th column in the second direction is defined as a fourth distance, and the third distance is equal to the fourth distance.

Preferably, the two first sub-pixels in the first sub-pixel group are driven by a driving circuit, or driven by two driving circuits respectively.

Preferably, at least one of the first sub-pixel group, second sub-pixel group and the third sub-pixel is uniformly distributed in the OLED pixel arrangement structure.

Preferably, the third sub-pixel is a green sub-pixel.

The present invention also provides a display panel, which comprises an OLED pixel arrangement structure, the OLED pixel arrangement structure further comprises: a first sub-pixel group, a second sub-pixel group, and a third sub-pixel; the n-th row of the OLED pixel arrangement structure comprising alternating arrangement of the first sub-pixel group and the second sub-pixel group at intervals; the (n+1)th row comprising a plurality of third sub-pixels arranged at intervals, and the third sub-pixel being disposed at the intervals between the first sub-pixel group and the second sub-pixel group, n being a positive integer.

Preferably, the first sub-pixel group comprises two first sub-pixels.

Preferably, the two first sub-pixels are arranged in a manner of upper-lower, left-right or diagonal positions in the first sub-pixel group.

Preferably, the second sub-pixel group comprises two second sub-pixels.

Preferably, distance between adjacent first sub-pixel group and second subpixel group in the n-th row is greater than or equal to width of a third sub-pixel, and distance between two adjacent third sub-pixels in the (n+1)th row is greater than or equal to width of one first sub-pixel group or one second sub-pixel group.

Preferably; the m-th column of the OLED pixel arrangement structure comprises alternating arrangement of the first sub-pixel group and the second sub-pixel group at intervals; the (m+1)th column comprises a plurality of third sub-pixels arranged at intervals; wherein distance between adjacent first sub-pixel group and second sub-pixel group in the m-th column is greater than or equal to height of a third sub-pixel, and distance between two adjacent third sub-pixels in the (m+1)th column is greater than or equal to the height of one first sub-pixel group or one second sub-pixel group, and m is a positive integer.

Preferably, the two first sub-pixels in the first sub-pixel group are driven by a driving circuit, or driven by two driving circuits respectively.

Preferably, at least one of the first sub-pixel group, second sub-pixel group and the third sub-pixel is uniformly distributed in the OLED pixel arrangement structure.

Preferably, the third sub-pixel is a green sub-pixel.

The present invention provides the following advantages: under the same resolution, in contrast to the conventional arrangement structure of the sub-pixels, the OLED pixel arrangement structure of the present invention adopts the structure form of sub-pixel groups, wherein the sub-pixels in the first sub-pixel group or the second sub-pixel group are the same color, which can overcome the problem that the distance between the openings of different color sub-pixels in the prior art having a minimum limitation, thereby reducing the difficulty of the FMM production, and can share the adjacent sub-pixels to achieve the same resolution display effect; or the difficulty of the production process can be reduced under the same resolution requirement.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

DETAILED DESCRIPTION OF THE PREFERRED EMBODIMENTS

To further explain the technical means and effect of the present invention, the following refers to embodiments and drawings for detailed description. Apparently, the described embodiments are merely some embodiments of the present invention, instead of all embodiments. All other embodiments based on embodiments in the present invention and obtained by those skilled in the art without departing from the creative work of the present invention are within the scope of the present invention.

The terms "comprising" and "having" and any variations thereof appearing in the specification, claims, and drawings of the present application are intended to cover non-exclusive inclusion. For example, a process, method, system, product, or device that includes a series of steps or units is not limited to the listed steps or units, but optionally also includes steps or units not listed, or alternatively, other steps or units inherent to these processes, methods, products or equipment. In addition, the terms "first", "second" and "third" are used to distinguish different objects, and are not intended to describe a particular order.

Figure 1:
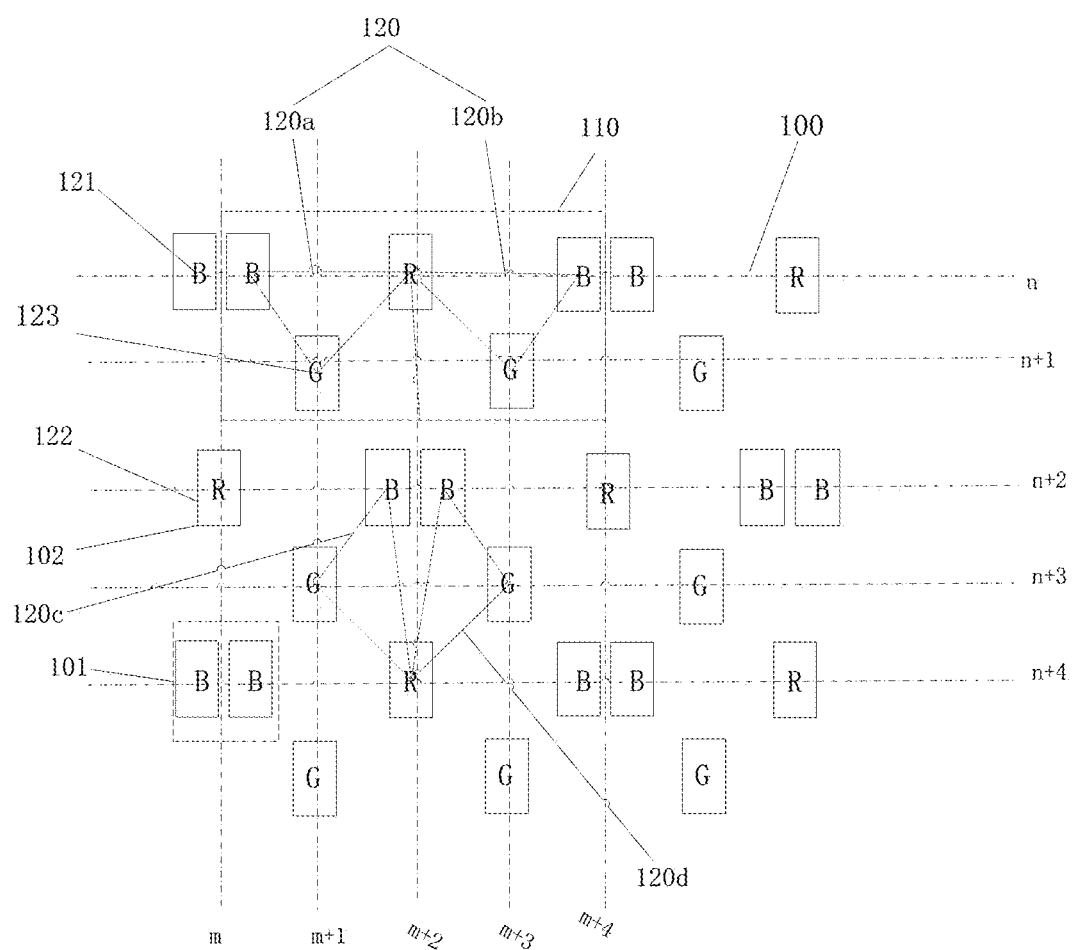
FIG. 1 is a schematic view showing the OLED pixel arrangement structure according to the first embodiment of the present invention.

As shown in FIG. 1, FIG. 1 is a schematic view showing the OLED pixel arrangement structure according to the first embodiment of the present invention. The OLED pixel arrangement structure 100 comprises a first sub-pixel group 101, a second sub-pixel group 102, and a third sub-pixel 123; the n-th row of the OLED pixel arrangement structure 100 comprises alternating arrangement of the first sub-pixel group 101 and the second sub-pixel group 102 at intervals; the (n+1)th row comprises a plurality of third sub-pixels 123 arranged at intervals, and the third sub-pixel 123 is disposed at the intervals between the first sub-pixel group 101 and the second sub-pixel group 102, n is a positive integer.

Colors of the sub-pixels pf the first sub-pixel group, the sub-pixels of the second sub-pixel group and the third sub-pixel are different. In the present embodiment, the color of the first sub-pixel 121 is blue, which is represented by B in the figure, and the color of the second sub-pixel 122 is red, which is represented by R in the figure, and the color of the third sub-pixel 123 is green, which is represented by G in the figure. This color configuration can ensure that the light-emitting effect is better. It should be understood that the colors of the three sub-pixels can be changed as required. It is also understandable that the colors of the sub-pixels in the present invention may also comprise white, i.e., any of the four colors of red, green, blue and white.

Moreover, in other embodiments, the first sub-pixel group 101 comprises two first sub-pixels 121. It should be noted that the first sub-pixel group 101 may also comprise three or more first sub-pixels 121. It should be understood that a plurality of the first sub-pixels 121 are uniformly distributed in the first sub-pixel group 101. When the first sub-pixel group 101 comprises exactly two first sub-pixels 121, the two first sub-pixels 121 may be distributed in the first sub-tuple group 101 in the form of upper-lower, left-right, or diagonal positions, or alternatively, using any position as rotational origin to rotate for a certain angle and then arranged in the first sub-pixel group 101. When the first sub-pixel group 101 comprises three first sub-pixels 121, the shape of the three first sub-pixels 121 may be configured to the shape of the three equal-divisions of the first sub-pixel group 101. For example, when the first sub-pixel group 101 is a circle, the first sub-pixel group 101 is divided into three parts based on the center of the circle, wherein each part occupies 120°, and then the shape of the first sub-pixels 121 is an arc of 120° of a circle centered on the circle center. It should be understood that, according to actual application, the circle of the first sub-pixel group 101 may be divided into three parts at any angle, and each part is the position occupied by the first sub-pixel 121. It should be understood that the first sub-pixel group 101 may also comprises four first sub-pixels 121.

Moreover, in other embodiments, the first sub-pixel group 101 comprises two first sub-pixels 121. It should be noted that the two first sub-pixels may be arranged adjacently, and such an arrangement can improve the light emission effect as well as overcome a problem in the prior art that the distance between openings of different color sub-pixels has a minimum limitation, thereby reducing the difficulty of FMM production.

It should be understood that the shapes of the first sub-pixel group, the second sub-pixel group, and the third sub-pixel may be, but are not limited to, quadrilaterals, rectangles, diamonds, circles, sectors, triangles, and polygons. The shapes of the first sub-pixel and the second sub-pixel may be, but not limited to, a quadrilateral, a rectangle, a diamond, a circle, a fan, a triangle, and a polygon.

In the present embodiment, the second sub-pixel group 102 comprises two second sub-pixels 122. As shown in FIG. 1, in the present embodiment, the n-th row and the adjacent (n+1)th row of the OLED pixel arrangement structure 100 constitute a plurality of pixel groups 110. Each pixel group 110 comprises two pixels 120, and a single pixel 120 comprises a first sub-pixel 121, a second sub-pixel 122, and a third sub-pixel 123. The two pixels 120 share a second sub-pixel 122, and the left pixel is formed by a first sub-pixel 121 on the right of the first sub-pixel group 101 at the n-th row and m-th column, a third sub-pixel 123 in the (n+1)th row and (m+1)th column, and a second sub-pixel 122 in the n-th row and (m+2)th column, shown as 120a in FIG. 1. The right pixel is formed by a second sub-pixel 122 at the n-th row and (m+2)th column, a third sub-pixel 123 in the (n+1)th row and (m+3)th column, and a first sub-pixel 121 on the left of the first sub-pixel group 101 in the n-th row and (m+4)th column, shown as 120b in FIG. 1.

Refer to FIG. 1 again. To illustrate the effect of improving the resolution of the OLED pixel arrangement structure of the present invention, in the OLED pixel arrangement structure 100 of the present invention, the pixel 120c and the pixel 120d can also be formed. The pixel 120c is formed by a first sub-pixel 121 on the left of the first sub-pixel group 101 in the (n+2)th row and (m+2)th column, a third sub-pixel 123 in the (n+3)th row and (m+1)th column, and a second sub-pixel 122 in the (n+4)th row and (m+2)th column; and the pixel 120d is formed by a first sub-pixel 121 on the right of the first sub-pixel group 101 in the (n+2)th row and (m+2)th column, a third sub-pixel 123 in the (n+3)th row and (m+3)th column, and a second sub-pixel 122 in the (n+4)th row and (m+2)th column.

Figure 2:
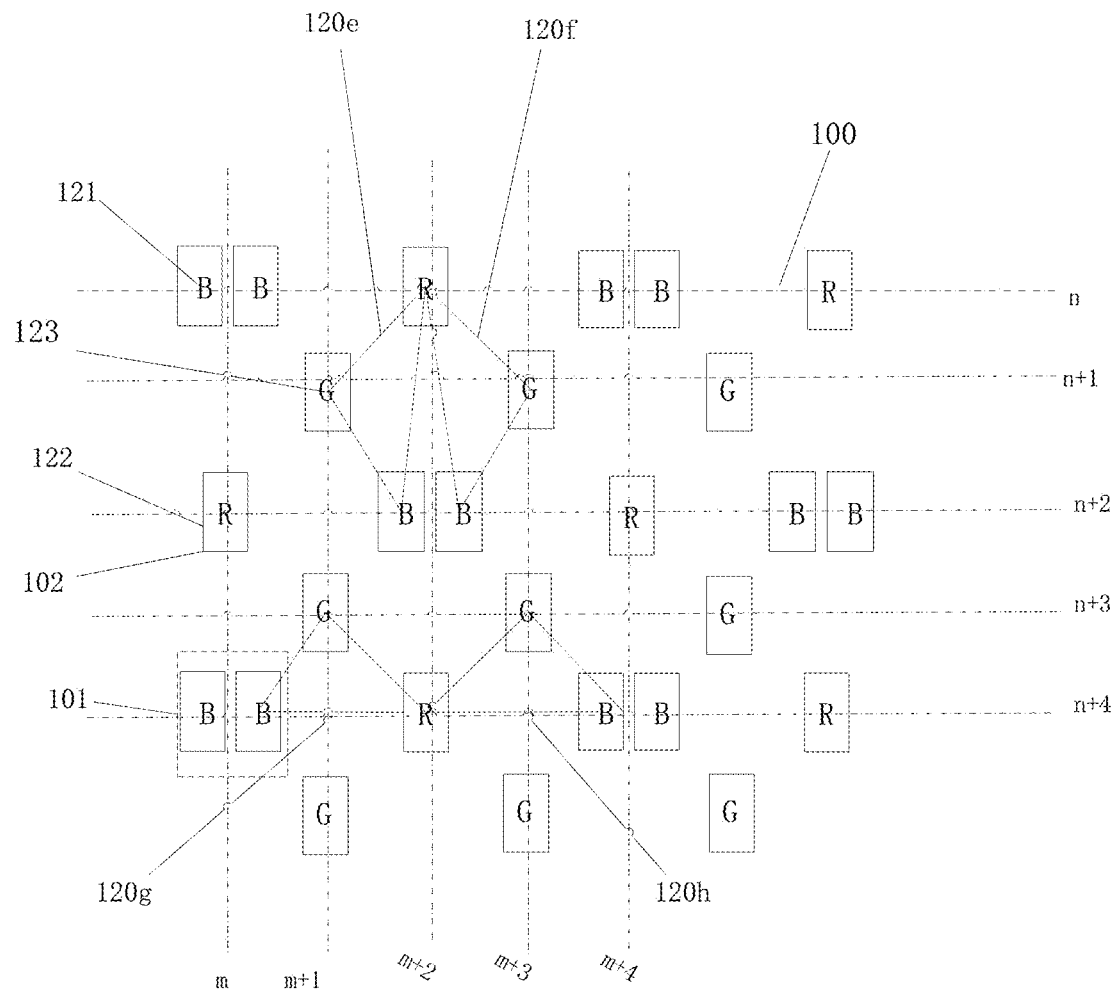
FIG. 2 is a schematic view showing the plurality of types of pixels formed in the OLED pixel arrangement structure according to the first embodiment of the present invention.

Refer to FIG. 2. To illustrate the effect of improving the resolution of the OLED pixel arrangement structure of the present invention, in the OLED pixel arrangement structure 100 of the present invention, the pixel 120e and the pixel 120f can also be formed. The pixel 120e is formed by a second sub-pixel 122 in the n-th row and (m+2)th column, a third sub-pixel 123 in the (n+1)th row and (m+1)th column, and a first sub-pixel 121 on the left of the first sub-pixel group 101 in the (n+2)th row and (m+2)th column; and the pixel 120f is formed by a second sub-pixel 122 in the n-th row and (m+2)th column, a third sub-pixel 123 in the (n+1)th row and (m+3)th column, and a first sub-pixel 121 on the right of the first sub-pixel group 101 in the (n+2)th row and (m+2)th column. Wherein the pixel 120e and the pixel 120f share a second sub-pixel 122.

Refer to FIG. 2. In the OLED pixel arrangement structure 100 of the present invention, the pixel 120g and the pixel 120h can also be formed. The pixel 120g is formed by a third sub-pixel 123 in the (n+3)th row and (m+1)th column, a first sub-pixel 121 on the right of the first sub-pixel group 101 in the (n+4)th row and m-th column, and a second sub-pixel 122 in the (n+4)th row and (m+2)th column; and the pixel 120h is formed by a third sub-pixel 123 in the (n+3)th row and (m+3)th column, a second sub-pixel 122 in the (n+4)th row and (m+2)th column, and a first sub-pixel 121 on the left of the first sub-pixel group 101 in the (n+4)th row and (m+4)th column. Wherein the pixel 120g and the pixel 120h share a second sub-pixel 122.

The above OLED pixel arrangement structure 100 can form a plurality types of pixels to improve light emission effect.

Wherein, the row direction or column direction in the OLED pixel arrangement structure 100 in the above embodiment is an OLED pixel arrangement structure that, after rotating the OLED pixel arrangement structure at a reasonable angle, is still applicable to the OLED pixel arrangement structure, and specifically, as such, the rows and columns of the OLED pixel arrangement structure are interchangeable. For example, the m-th row and m-th column when the first arrangement direction is the row direction are equivalent to the m-th row and n-th column when the first arrangement direction is the column direction. Specifically, when the first arrangement direction is the row direction, a sub-pixel in the m-th row and n-th column, after rotating the OLED pixel arrangement structure (eg., by clockwise 90° or counter-clockwise 90°), is located in the n-th row and m-th. Correspondingly, at this time, the first arrangement direction is the column direction.

Moreover, in other embodiments, the second sub-pixel group 102 comprises two second sub-pixels 122. It should be noted that the second sub-pixel group 102 may also comprise three or more second sub-pixels 122. It should be understood that a plurality of the second sub-pixels 122 are uniformly distributed in the second sub-pixel group 102. When the second sub-pixel group 102 comprises exactly two second sub-pixels 122, the two second sub-pixels 122 may be distributed in the second sub-tuple group 102 in the form of upper-lower, left-right, or diagonal positions, or alternatively, using any position as rotational origin to rotate for a certain angle and then arranged in the second sub-pixel group 102. When the second sub-pixel group 102 comprises three second sub-pixels 122, the shape of the three second sub-pixels 122 may be configured to the shape of the three equal-divisions of the second sub-pixel group 102. For example, when the second sub-pixel group 102 is a circle, the second sub-pixel group 102 is divided into three parts based on the center of the circle, wherein each part occupies 120°, and then the shape of the second sub-pixels 122 is an arc of 120° of a circle centered on the circle center. It should be understood that, according to actual application, the circle of the second sub-pixel group 102 may be divided into three parts at any angle, and each part is the position occupied by the second sub-pixel 122. It should be understood that the second sub-pixel group 102 may also comprises four second sub-pixels 122.

Figure 3:
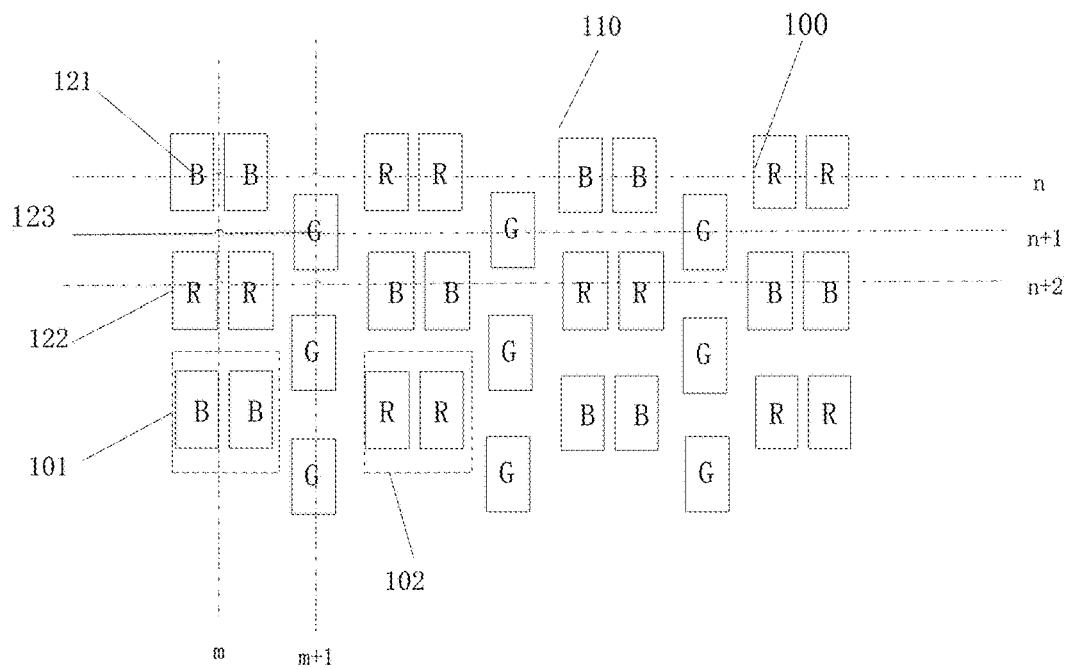
FIG. 3 is a schematic view showing the OLED pixel arrangement structure according to the second embodiment of the present invention.

Refer to FIG. 3. Moreover, the second sub-pixel group 102 comprises two second sub-pixels 122. It should be noted that the two second sub-pixels 122 may be arranged adjacently, and such an arrangement can improve the light emission effect as well as overcome a problem in the prior art that the distance between openings of different color sub-pixels has a minimum limitation, thereby reducing the difficulty of FMM production. In the embodiment, the first sub-pixel group 101 and the second sub-pixel 102 have paired sub-pixels, which can effectively light emission effect.

Wherein, "the third sub-pixel 123 is disposed at the intervals between the first sub-pixel group 101 and the second sub-pixel group 102" may be understood that the third sub-pixel 123 is disposed in the adjacent row at position corresponding to the interval between the first sub-pixel group 101 and the second sub-pixel group 102. Or, a portion of the third sub-pixel 123 is disposed in the same row at position corresponding to the interval between the first sub-pixel group 101 and the second sub-pixel group 102. Or, T a portion of the third sub-pixel 123 is disposed in the same column at position corresponding to the interval between the first sub-pixel group 101 and the second sub-pixel group 102. The specifics is described as follows.

Refer to FIG. 3 again. In the second embodiment of OLED pixel arrangement structure 100 provided by the present invention, the distance between adjacent first sub-pixel group 101 and second subpixel group 102 in the n-th row is greater than or equal to width of a third sub-pixel 123, and distance between two adjacent third sub-pixels 123 in the (n+1)th row is greater than or equal to width of one first sub-pixel group 101 or one second sub-pixel group 102. As shown in FIG. 3, a portion of the third sub-pixels 123 are disposed between the first sub-pixel group 101 and the second sub-pixel group 102 in the n-th row, or the same third sub-pixel 123 is partially disposed between the first sub-pixel group 101 and the second sub-pixel group 102 in the n-th row, and partially disposed between the first sub-pixel group 101 and the second sub-pixel group 102 in the (n+2)th row. Such arrangement structure can make the sub-pixels more compact, improve the arrangement density of sub-pixels per unit area, and improve display brightness.

Figure 4:
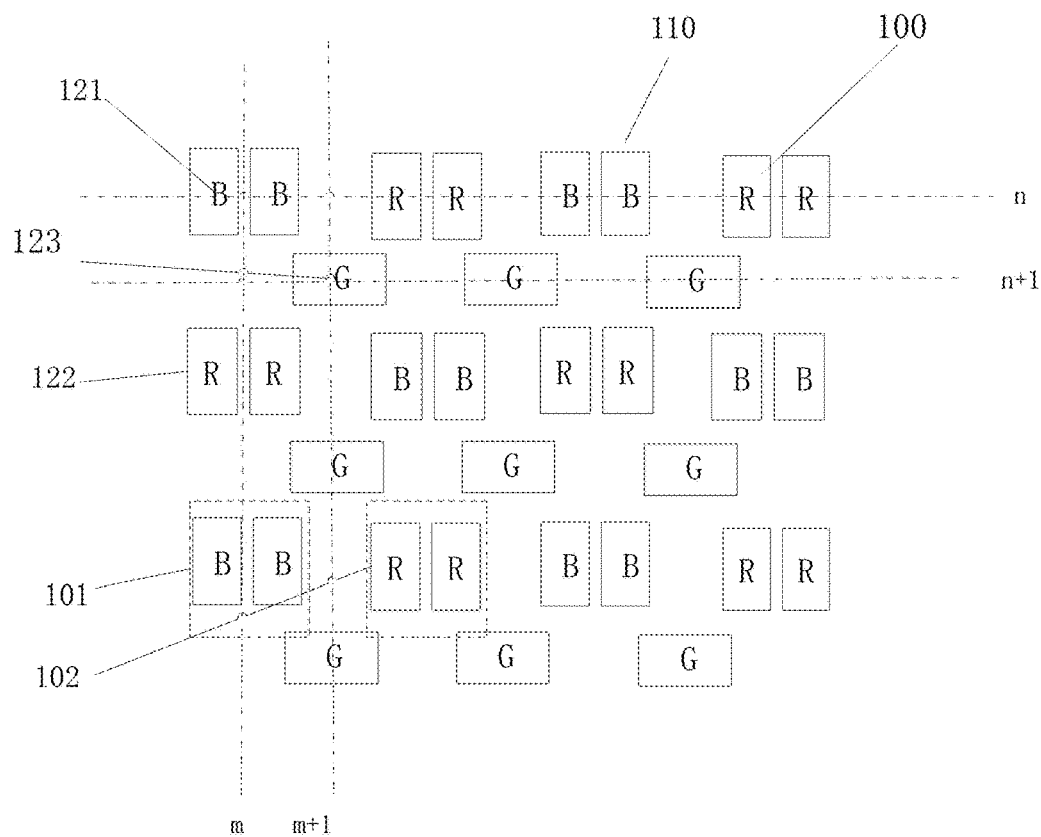
FIG. 4 is a schematic view showing the OLED pixel arrangement structure according to the third embodiment of the present invention.

Refer to FIG. 4. In the third embodiment of OLED pixel arrangement structure 100 provided by the present invention, the m-th column of the OLED pixel arrangement structure 100 comprises alternating arrangement of the first sub-pixel group 101 and the second sub-pixel group 102 at intervals; the (m+1)th column comprises a plurality of third sub-pixels 123 arranged at intervals, wherein the distance between adjacent first sub-pixel group 101 and second sub-pixel group 102 in the m-th column is greater than or equal to height of a third sub-pixel 123, and distance between two adjacent third sub-pixels 123 in the (m+1)th column is greater than or equal to the height of one first sub-pixel group 101 or one second sub-pixel group 102, and m is a positive integer. As shown in FIG. 4, a portion of the third sub-pixels 123 are disposed between the first sub-pixel group 101 and the second sub-pixel group 102 in the m-th column, or the same third sub-pixel 123 is partially disposed between the first sub-pixel group 101 and the second sub-pixel group 102 in the m-th column, and partially disposed between the first sub-pixel group 101 and the second sub-pixel group 102 in the (m+2)th column. Such arrangement structure can make the sub-pixels more compact, improve the arrangement density of sub-pixels per unit area, and improve display brightness.

Figure 5:
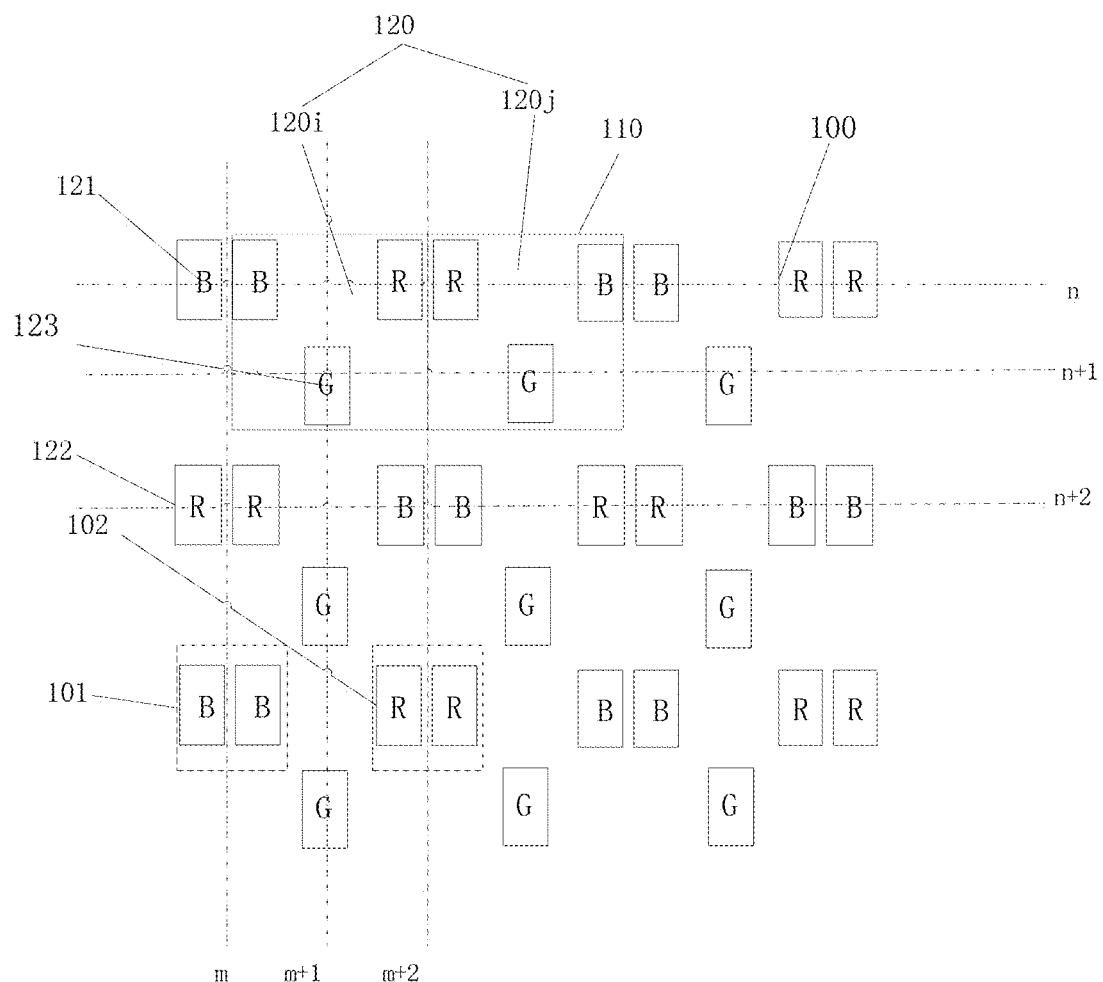
FIG. 5 is a schematic view showing the OLED pixel arrangement structure according to the fourth embodiment of the present invention.

Refer to FIG. 5. In the fourth embodiment of OLED pixel arrangement structure 100 provided by the present invention, the distance between the first sub-pixel group 101 in the n-th row and m-th column and the third sub-pixel 123 in the (n+1)th row and (m+1)th column in a first direction is defined as a first distance, distance between the second sub-pixel group 102 in the n-th row and (m+2)th column and the third sub-pixel 123 in the (n+1)th row and (m+1)th column in the first direction is defined as a second distance, and the first distance is equal to the second distance. At this point, the first distance and the second distance in the first direction are equal, so that the sub-pixel arrangement is more uniform, and the formed pixels have better light emission effect. The first direction is a horizontal direction, and it can be understood that, when the OLED pixel arrangement structure 100 is rotated by 90°, the first direction is a vertical direction.

Moreover, in other embodiments of the OLED pixel arrangement structure 100, the distance between the first sub-pixel group 101 in the n-th row and m-th column and the third sub-pixel 123 in the (n+1)th row and (m+1)th column in a second direction is defined as a third distance, distance between the second sub-pixel group 120 in the (n+2)th row and m-th column and the third sub-pixel 123 in the (n+1)th row and (m+1)th column in the second direction is defined as a fourth distance, and the third distance is equal to the fourth distance. At this point, the third distance and the fourth distance in the second direction are equal, so that the sub-pixel arrangement is more uniform, and the formed pixels have better light emission effect. The second direction is a vertical direction, and it can be understood that, when the OLED pixel arrangement structure 100 is rotated by 90°, the second direction is a horizontal direction.

Refer to FIG. 5 again. The n-th row and the adjacent (n+1)th row in the OLED pixel arrangement structure 100 form a plurality of pixel groups 110, and each pixel groups 110 is formed by a pixel 120*i* and a pixel 120*j*. the pixel 120*i* and the pixel 120*j* are symmetrical with respect to the shared side of the two pixels. The pixel 120*i* comprises a first sub-pixel 121, a second sub-pixel 122, and a third sub-pixel 123, and the first sub-pixel 121, the second sub-pixel 122, and the third sub-pixel 123 are arranged in the pixel 120 in an inverted triangular shape. The first sub-pixel 121 and the second sub-pixel 122 form an upper part of an inverted-triangle, and the third sub-pixel forms a lower part of an inverted-triangle. The distance between the first sub-pixel 121 and the second sub-pixel 122 is greater than or equal to the width of the third sub-pixel 123. The adjacent sub-pixels in the pixels 120*i*, 120*j* of the pixel group 110 are the same.

In one of the embodiments, if a pixel 120 is equally divided into six equal parts in two rows and three columns of the upper three equal parts and the lower third equal parts, then the first sub-pixel 121 is located at the upper left part. The second sub-pixel 122 is located at the upper right part, and the third sub-pixel 123 is located at the lower middle part. It should be understood that the positions of the first sub-pixel 121 and the second subpixel 122 in adjacent pixels 120 are reversed, that is, the adjacent two pixels are symmetrical with respect to the shared side.

Figure 6:
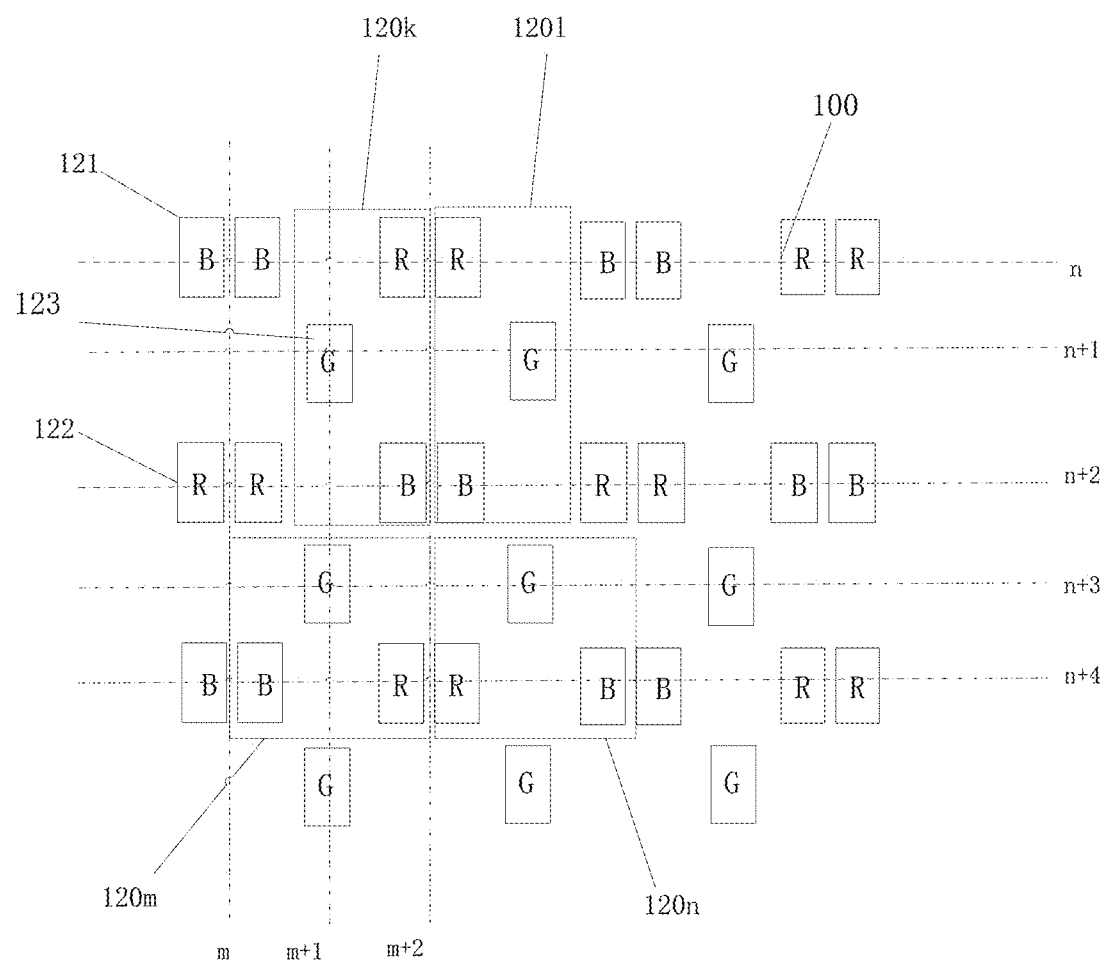
FIG. 6 is a schematic view showing the plurality of types of pixels formed in the OLED pixel arrangement structure according to the fourth embodiment of the present invention.

Refer to FIG. 6. To illustrate the effect of improving the resolution of the OLED pixel arrangement structure 100 of the present invention, the OLED pixel arrangement structure 100 of the present invention can also form the pixel 120*k* and the pixel 120*l*. The pixel 120*k* is formed by a second sub-pixel 122 on the left in the second sub-pixel group 102 in the n-th row and (m+2)th column, a third sub-pixel 123 in the (n+1)th row and (m+1)th row, and a first sub-pixel 121 in the (n+2)-th row and (m+2)th column, wherein the second sub-pixel 122 and the first sub-pixel 121 are in the same column and are spaced apart from each other by more than or equal to the height of the third sub-pixel 123, and the third sub-pixel 123 is located on the left side of the first sub-pixel 121 and the second sub-pixel 122. In the figure, the pixel 120*l* and the pixel 120*k* are symmetric with respect to the shared side, and the third subpixel 123 in the pixel 120*l* is located on the right side of the first sub-pixel 121 and the second sub-pixel 122.

Refer to FIG. 6 again. The OLED pixel arrangement structure 100 of the present invention can also form the pixel 120*m* and the pixel 120*n*. The pixel 120*m* is formed by a third sub-pixel 123 in the (n+3)th row and (m+1)th row, a first sub-pixel 121 on the right in the first sub-pixel group 101 in the (n+4)-th row and m-th column, and a second sub-pixel 122 on the left in the second sub-pixel group 102 in the (n+4)th row and (m+1)th column, wherein the first sub-pixel 121 in the (n+4)th row and the second sub-pixel 122 in the (n+4)th row are spaced apart from each other by more than or equal to the width of the third sub-pixel 123. The pixel 120*n* and the pixel 120*m* are symmetric with respect to the shared side.

The above arrangement of the OLED pixel arrangement structure allows two adjacent first sub-pixels form a first sub-pixel group and two adjacent second sub-pixels form a second sub-pixel group. In other words, the first sub-pixels or the second sub-pixels in different but adjacent pixels may be adjacent. The two first sub-pixels in the first sub-pixel group are of the same color and the two second sub-pixels in the second sub-pixel group are of the same color, which can overcome the problem that the distance between the openings of different color sub-pixels in the prior art has a minimum limitation, so that the same opening can be used by the mask during production to reduces the mask-making difficulty. Alternatively, the resolution of the OLED pixel arrangement structure can be effectively improved without changing the accuracy of the mask.

It should be understood that the formed plurality of pixel types in the fourth embodiment are also applicable to the second embodiment and the third embodiment, which will not be repeated here.

Moreover, the first sub-pixel group 101 has an integrated structure, and the two first sub-pixels 121 in the first sub-pixel group 101 are vapor-deposited together during the manufacturing process. The second sub-pixel group 102 is an integral structure, and two second sub-pixels 122 in the second sub-pixel group 102 are vapor-deposited together during the manufacturing process.

Moreover, the two first sub-pixels 121 in the first sub-pixel group 101 are commonly driven by one driving circuit or driven by two driving circuits respectively. The two second sub-pixels 122 in the second sub-pixel group 102 are commonly driven by one driving circuit or driven by two driving circuits respectively. Such design can improve the light emission efficiency and reduce the difficulty of manufacturing the drive circuit.

Moreover, at least one of the first sub-pixel group 101, second sub-pixel group 102 and the third sub-pixel 123 is uniformly distributed in the OLED pixel arrangement structure 100. Therefore, when the OLED pixel arrangement structure 100 is applied to the display panel, the image displayed by the display panel is not prone to jaggies or color edges, thereby improving the display quality.

Figure 7:
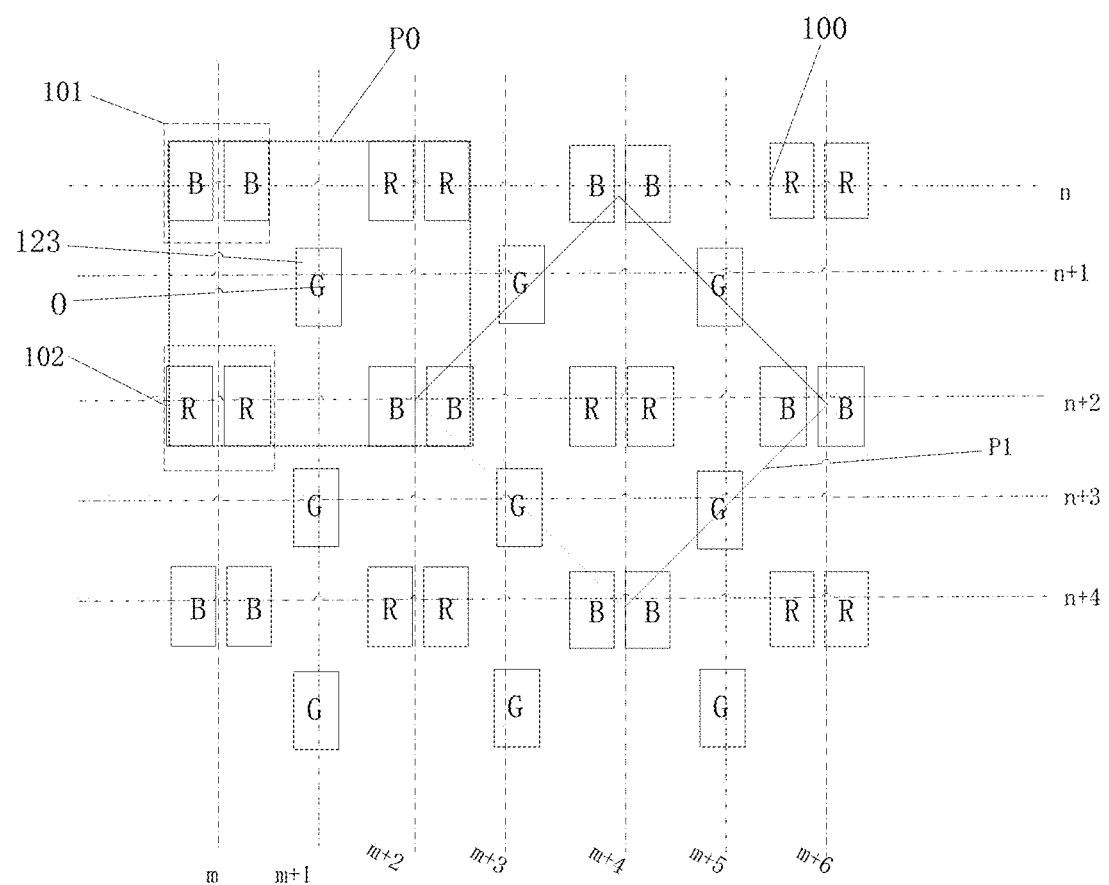
FIGS. 7-9 are schematic views showing the uniform distribution of the first sub-pixel group, the second sub-pixel group and the third sub-pixel in in the OLED pixel arrangement structure according to the fourth embodiment of the present invention.

Refer to FIG. 7. Optionally, the first sub-pixel group 101 in the n-th row and m-th column, the second sub-pixel group 102 in the n-th row and (m+2)th column, the second sub-pixel group 102 in the (n+2)th row and the m-th column, and first sub-pixel group 101 in the (n+2)th row and (m+2)th column form a quadrilateral P0 and center 0 of the quadrilateral P0 overlaps with center 0 of the third sub-pixel 123 in the (n+1)th row and (m+1)th column. Such center-aligned structure arrangement can make the display effect of the OLED pixel arrangement structure better and not prone to appear jaggies and color edges, and the display quality is improved.

It should be understood that the third sub-pixel 123 in the (n+1)th row and (m+1)th column, the third sub-pixel 123 in the (n+1)th row and (m+3)th column, the third sub-pixel 123 in the (n+3)th row and (m+1)th column, and the third sub-pixel 123 in the (n+3)th row and (m+3)th column form a quadrilateral and center of the quadrilateral overlaps with center of the first sub-pixel group 101 in the (n+2)th row and (m+2)th column. Or, the third sub-pixel 123 in the (n+1)th row and (m+3)th column, the third sub-pixel 123 in the (n+3)th row and (m+3)th column, the third sub-pixel 123 in the (n+1)th row and (m+5)th column, and the third sub-pixel 123 in the (n+3)th row and (m+5)th column form a quadrilateral and center of the quadrilateral overlaps with center of the first sub-pixel group 101 in the (n+2)th row and (m+4)th column. Such center-aligned structure arrangement can make the display effect of the OLED pixel arrangement structure better and not prone to appear jaggies and color edges, and the display quality is improved.

Refer to FIG. 7 again. Optionally, the first sub-pixel group 101 in the n-th row and (m+4)th column, the first sub-pixel group 101 in the (n+2)th row and (m+4)th column, the first sub-pixel group 101 in the (n+2)th row and the (m+2)th column, and first sub-pixel group 101 in the (n+4)th row and (m+4)th column form a parallelogram P1. The first sub-pixel group 101 adopting such an arrangement is uniformly distributed in the OLED pixel arrangement structure 100 so that when the OLED pixel arrangement structure 100 is applied to display panel, the image displayed by the display panel is not prone to jaggies and color edges, and the display quality is improved.

Figure 8:
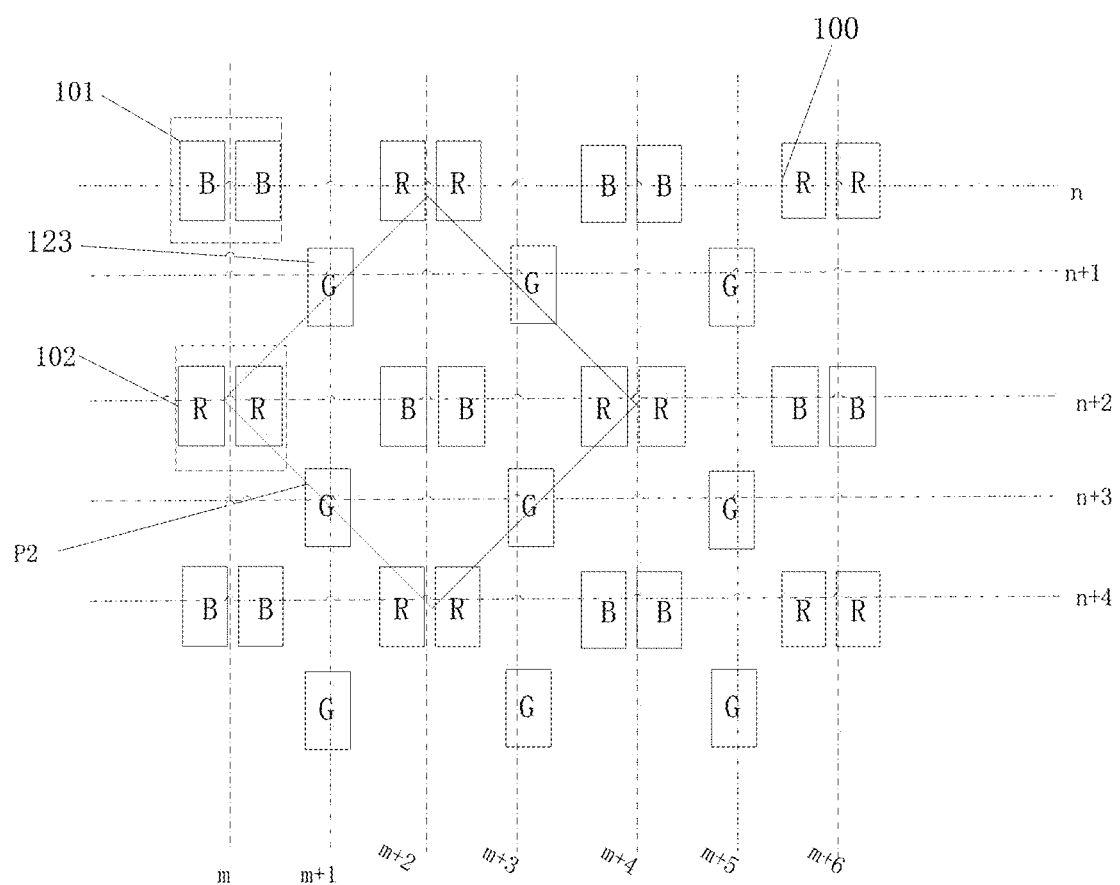

Optionally, the second sub-pixel group 102 in the n-th row and (m+2)th column, the second sub-pixel group 102 in the (n+2)th row and m-th column, the second sub-pixel group 102 in the (n+2)th row and the (m+4)th column, and second sub-pixel group 102 in the (n+4)th row and (m+2)th column form a parallelogram P2. Refer to FIG. 8. The second sub-pixel group 102 adopting such an arrangement is uniformly distributed in the OLED pixel arrangement structure 100 so that when the OLED pixel arrangement structure 100 is applied to display panel, the image displayed by the display panel is not prone to jaggies and color edges, and the display quality is improved.

Figure 9:
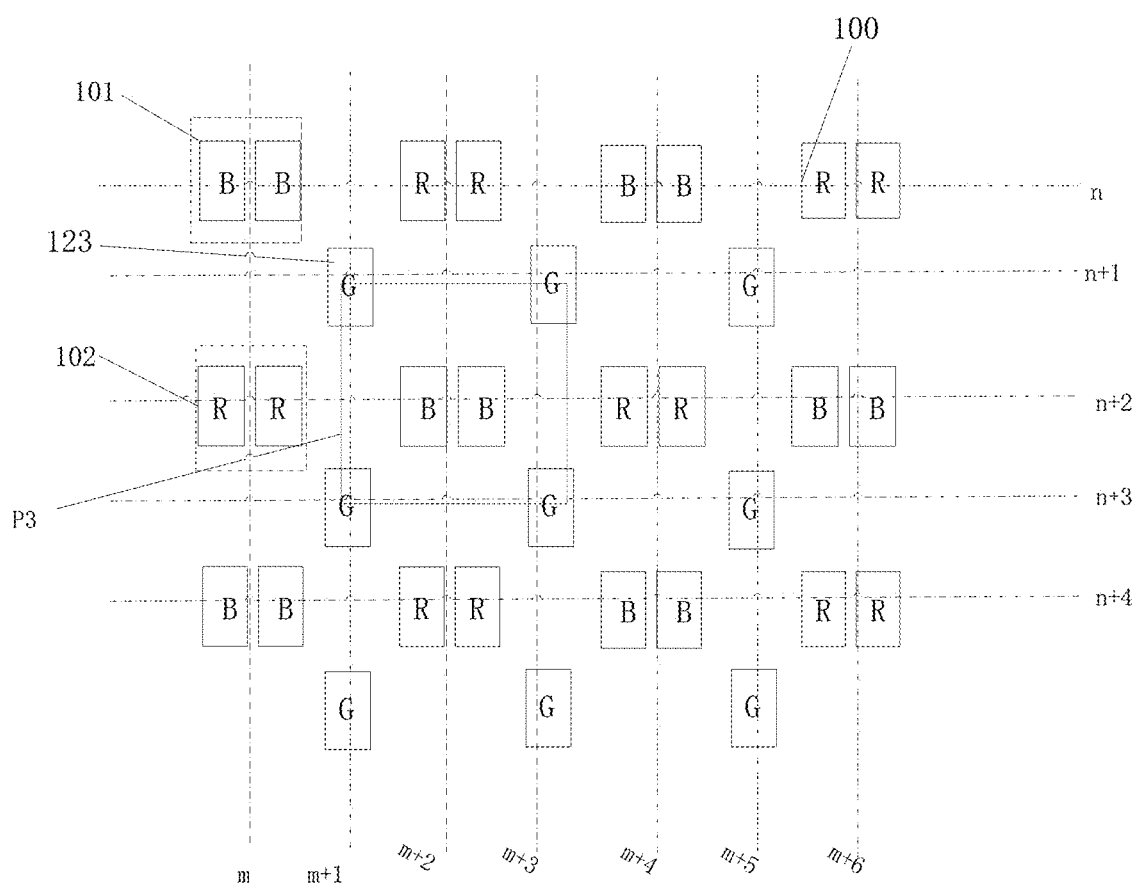

Optionally, the third sub-pixel 123 in the (n+1)th row and (m+1)th column, the third sub-pixel 123 in the (n+1)th row and (m+3)th column, the third sub-pixel 123 in the (n+3)th row and (m+1)th column, and the third sub-pixel 123 in the (n+3)th row and (m+3)th column form a rectangle P3. Refer to FIG. 9. The third sub-pixel 103 adopting such an arrangement is uniformly distributed in the OLED pixel arrangement structure 100 so that when the OLED pixel arrangement structure 100 is applied to display panel, the image displayed by the display panel is not prone to jaggies and color edges, and the display quality is improved.

Figure 10:
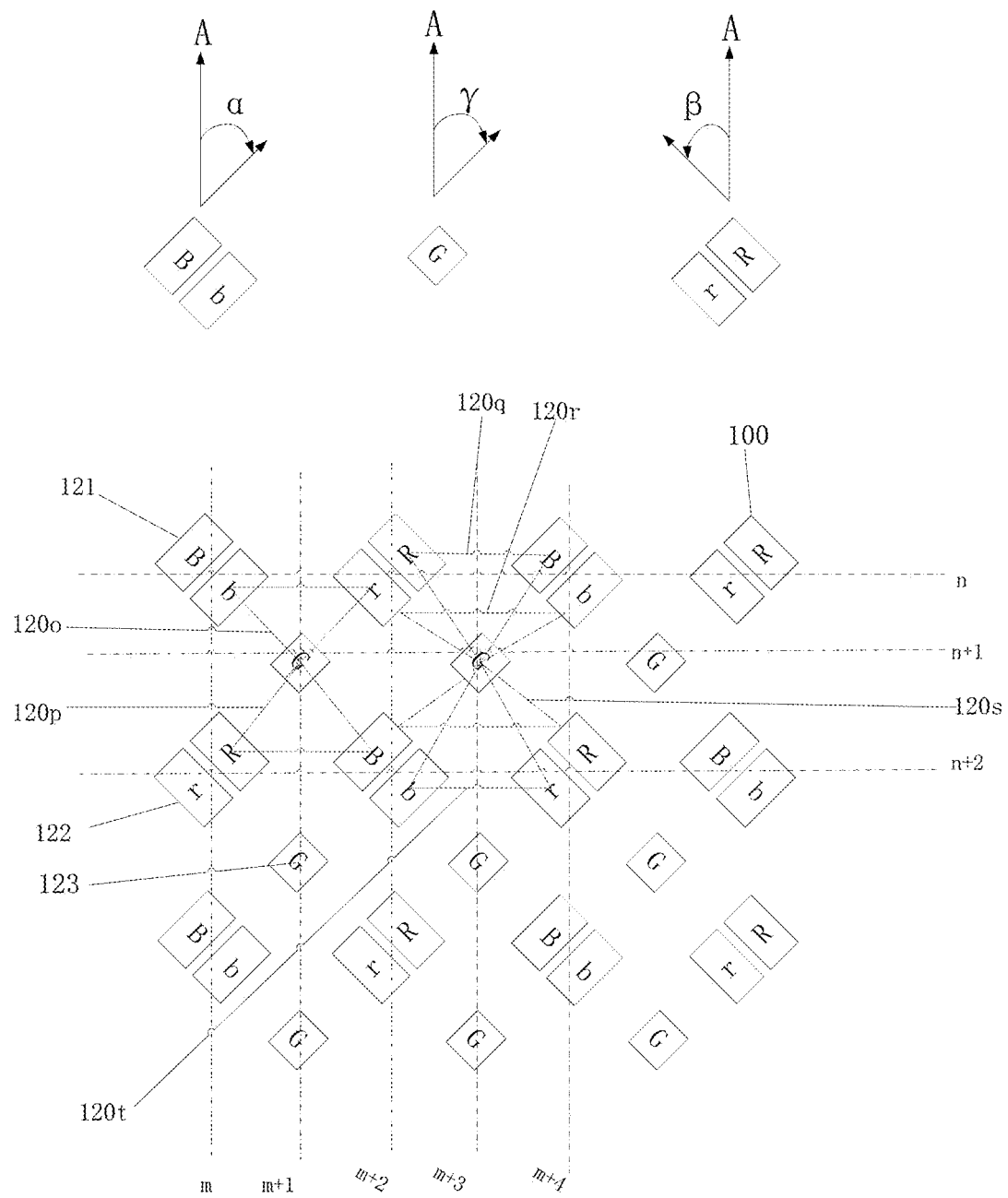
FIG. 10 is a schematic view showing the OLED pixel arrangement structure according to the fifth embodiment of the present invention.

Refer to FIG. 10. In the fifth embodiment of the OLED pixel arrangement structure 100 provided by the present invention, the first sub-pixel group 101 is rotated clockwise by a first preset angle. It should be understood that, with the column direction as the second direction A, the first sub-pixel group 101 uses the second direction A as reference and rotates the first preset angle α in the clockwise direction. It may be understood that the two first sub-pixels 121 in the first sub-pixel group 101 rotate clockwise by the first preset angle α. The first preset angle α is 0-180°.

Moreover, the second sub-pixel group 102 is rotated counterclockwise by a second preset angle. It should be understood that, with the column direction as the second direction A, the second sub-pixel group 102 uses the second direction A as reference and rotates the second preset angle α in the counterclockwise direction. It may be understood that the two second sub-pixels 122 in the second sub-pixel group 102 rotate clockwise by the second preset angle β. The first preset angle 3 is 0-180°.

Moreover, the third sub-pixel 123 is rotated clockwise by a third preset angle γ. The third preset angle γ is 0-180°.

It may be understood that the first preset angle α, the second preset angle β, and the third preset angle γ may be all equal to one another, or two of the angles may be equal to each other, or the three angles are all different. The angles can be arbitrarily preset as needed.

Moreover, in an embodiment, the first preset angle α, the second preset angle β and the third preset angle γ are equal. In a preferred embodiment, the first preset angle α=the second preset angle β=the third preset angle γ=45°.

Refer to FIG. 10 again. In the OLED pixel arrangement structure 100 of the present invention, the pixel 120o, the pixel 120p, the pixel 120q, the pixel 120r, the pixel 120s, and the pixel 120t can be formed. To clearly illustrate the composition of the pixel, the first sub-pixel 121 in the first sub-pixel group 101 located slightly upper in the second direction is labeled as the first sub-pixel B, the first sub-pixel 121 located slightly lower in the second direction is labeled as the first sub-pixel b, as shown in FIG. 10. Similarly, the second sub-pixel 122 in the second sub-pixel group 102 located slightly upper in the second direction is labeled as the second sub-pixel R, the second sub-pixel 122 located slightly lower in the second direction is labeled as the second sub-pixel r, as shown in FIG. 10.

The pixel 120o is formed by the first sub-pixel b in the n-th row and m-th column, the third sub-pixel 123 in the (n+1)th row and (m+1)th column, and the second sub-pixel r in the n-th row and (m+2)th column.

The pixel 120p is formed by the second sub-pixel R in the (n+2)th row and m-th column, the third sub-pixel 123 in the (n+1)th row and (m+1)th column, and the first sub-pixel B in the (n+2)th row and (m+2)th column.

The pixel 120q is formed by the second sub-pixel R in the n-th row and (m+2)th column, the third sub-pixel 123 in the (n+1)th row and (m+3)th column, and the first sub-pixel B in the n-th row and (m+4)th column.

The pixel 120r is formed by the second sub-pixel r in the n-th row and (m+2)th column, the third sub-pixel 123 in the (n+1)th row and (m+3)th column, and the first sub-pixel b in the n-th row and (m+4)th column.

The pixel 120s is formed by the first sub-pixel B in the (n+2)th row and (m+2)th column, the third sub-pixel 123 in the (n+1)th row and (m+3)th column, and the second sub-pixel R in the (n+2)th row and (m+4)th column.

The pixel 120t is formed by the first sub-pixel b in the (n+2)th row and (m+2)th column, the third sub-pixel 123 in the (n+1)th row and (m+3)th column, and the second sub-pixel r in the (n+2)th row and (m+4)th column.

Figure 11:
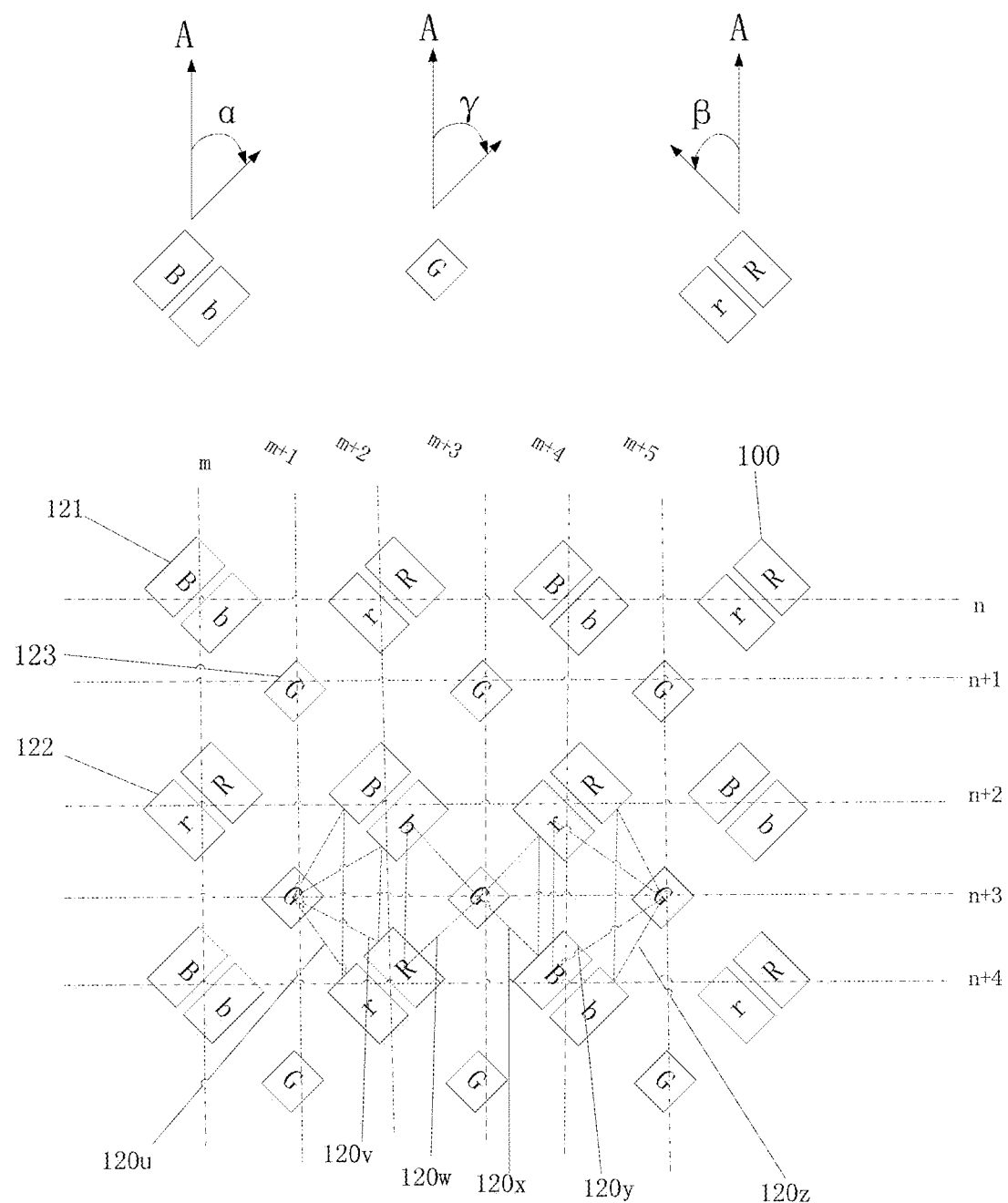
FIG. 11 is a schematic view showing the plurality of types of pixels formed in the OLED pixel arrangement structure according to the fifth embodiment of the present invention.

Refer to FIG. 11. In the OLED pixel arrangement structure 100 of the present invention, the pixel 120u, the pixel 120v, the pixel 120w, the pixel 120x, the pixel 120y, and the pixel 120z can be formed.

The pixel 120u is formed by the first sub-pixel B in the (n+2)th row and (m+2)th column, the third sub-pixel 123 in the (n+3)th row and (m+1)th column, and the second sub-pixel r in the (n+4)th row and (m+2)th column.

The pixel 120v is formed by the first sub-pixel b in the (n+2)th row and (m+2)th column, the third sub-pixel 123 in the (n+3)th row and (m+1)th column, and the second sub-pixel R in the (n+4)th row and (m+2)th column.

The pixel 120w is formed by the first sub-pixel b in the (n+2)th row and (m+2)th column, the third sub-pixel 123 in the (n+3)th row and (m+3)th column, and the second sub-pixel R in the (n+4)th row and (m+2)th column.

The pixel 120x is formed by the second sub-pixel r in the (n+2)th row and (m+4)th column, the third sub-pixel 123 in the (n+3)th row and (m+3)th column, and the first sub-pixel B in the (n+4)th row and (m+4)th column.

The pixel 120y is formed by the second sub-pixel r in the (n+2)th row and (m+4)th column, the third sub-pixel 123 in the (n+3)th row and (m+5)th column, and the first sub-pixel B in the (n+4)th row and (m+4)th column.

The pixel 120z is formed by the second sub-pixel R in the (n+2)th row and (m+4)th column, the third sub-pixel 123 in the (n+3)th row and (m+5)th column, and the first sub-pixel b in the (n+4)th row and (m+4)th column.

The plurality of pixel types shown in the fifth embodiment of the present invention can further improve the resolution and display effect.

Figure 12:
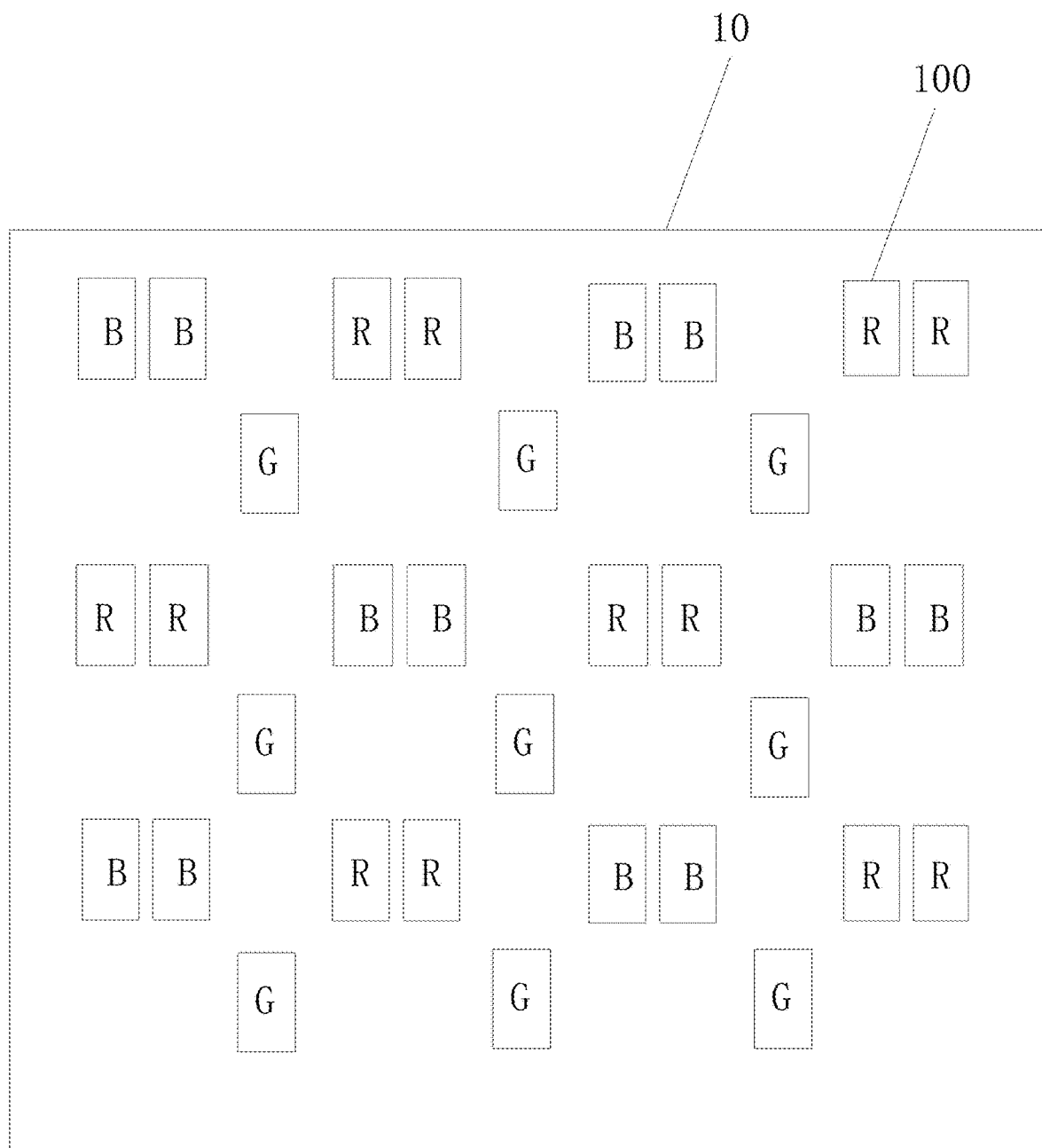
FIG. 12 is a schematic view showing the display panel according to the present invention.

Refer to FIG. 12. The present invention also provides a display panel 10, which comprises an OLED pixel arrangement structure 100 described above. The display panel 10 can be a flexible panel or a non-flexible panel.

Figure 13:
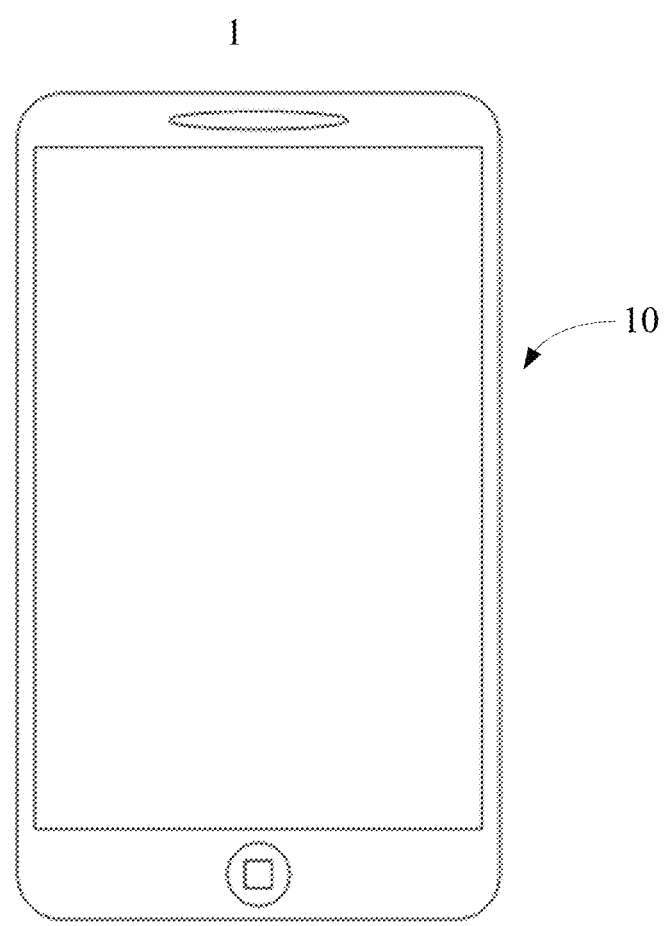
FIG. 13 is a schematic view showing the structure of the OLED display device according to the present invention.

Refer to FIG. 13. The present invention also provides an OLED display device 1, which comprises: a display panel 10 described above. For the OLED pixel arrangement structure 100 in the display panel 10, refer to the above description of the OLED pixel arrangement structure 100, which will not be repeated herein. The OLED display device 1 may be, but is not limited to, an e-book, a smart phone (such as an Android mobile phone, an iOS mobile phone, a Windows Phone mobile phone, etc.), a tablet, a flexible palmtop computer, a flexible notebook computer, and a mobile internet device (MID) or wearable devices. The OLED display device 1 may be flexible.

Figure 14:
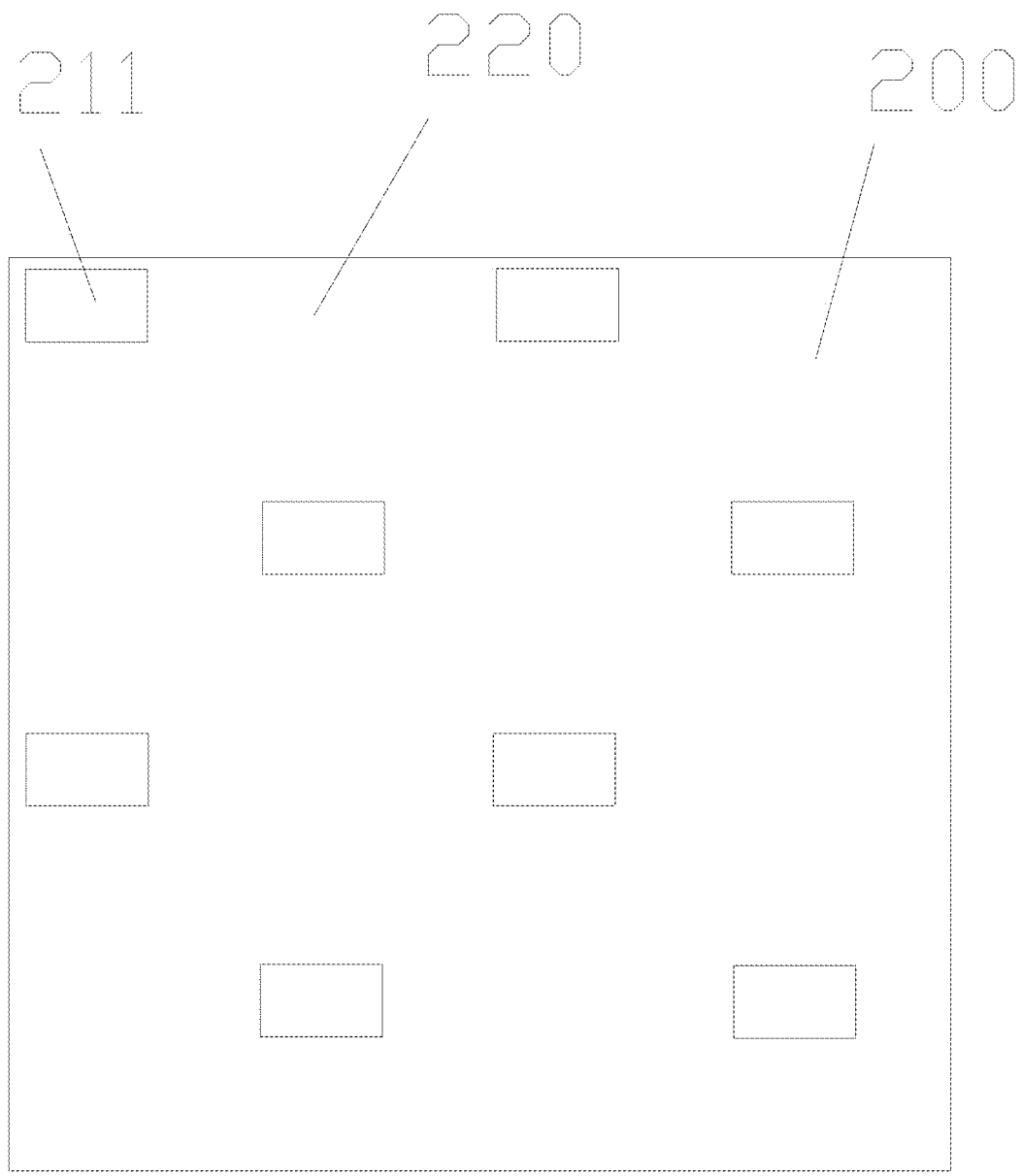
FIG. 14 is a schematic view showing the mask structure used in vapor-depositing a color in the OLED pixel arrangement structure according to the present invention.

Refer to FIG. 14. The present invention also provides an embodiment of a mask 200, which comprises an opening 211 and a non-opening area 220, and the opening 211 is consistent with an area formed by the adjacent sub-pixels of the same color. The non-opening area 220 is the same as the area formed by the sub-pixels corresponding to all the non-opening colors.

Moreover, the two first sub-pixels 121 in the first sub-pixel group 101 share an opening 211, and the two second sub-pixels 122 in the second sub-pixel group 102 share an opening 211. In the present embodiment, the FMM vacuum evaporation technology is used. After the first sub-pixel group 101 is vapor-deposited, the mask is moved by the distance of the sum of the first sub-pixel group 101 and the distance between the first sub-pixel 101 and the second sub-pixel group 102 so that the opening 211 corresponds to the second sub-pixel group 102. Then, the second sub-pixel group 102 is deposited by evaporation. The difference between the mask of the present invention and the mask in the prior art lies in that the opening 211 of the present embodiment corresponds to at least two first sub-pixel 121 or two second sub-pixels 122, which reduces the manufacturing difficulty in the OLED pixel arrangement structure of the same resolution.

It should be noted that each of the embodiments in this specification is described in a progressive manner, each of which is primarily described in connection with other embodiments with emphasis on the difference parts, and the same or similar parts may be seen from each other. For the device embodiment, since it is substantially similar to the method embodiment, the description is relatively simple and the relevant description may be described in part of the method embodiment.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An organic light emitting diode (OLED) pixel arrangement structure, comprising a number of rows of sub-pixels comprising: first sub-pixel groups each of which comprises at least one first sub-pixel, second sub-pixel groups each of which comprises at least one second sub-pixel, and third sub-pixels, at least one of the first and second sub-pixel groups comprising multiple sub-pixels, wherein an n-th row of the number of rows of the OLED pixel arrangement structure comprises alternating arrangement of multiple ones of the first sub-pixel groups and multiple ones of the second sub-pixel groups at intervals; and an (n+1)th row of the number of rows is one of the row next to the nth row and comprises multiple ones of third sub-pixels arranged at intervals, and the third sub-pixels are respectively disposed at the intervals between the first sub-pixel groups and the second sub-pixel groups, where n is a positive integer such that the n-th row is selected as one of the number of rows that has a row located next thereto in a predetermined direction, wherein for two adjacent rows of the number of rows, a preceding row in the predetermined direction comprises the first sub-pixel groups and the second sub-pixels alternating each other and a following row that follows the preceding row in the predetermined direction comprises individual ones of the third sub-pixels, such that the individual third sub-pixels are disposed at the intervals between the first sub-pixel groups and the second sub-pixel groups, and wherein each of the preceding rows that comprise the first sub-pixel groups and the second sub-pixels alternating each other is arranged between two of the following rows adjacent thereto; and each of the following rows that comprise individual ones of the third sub-pixels is arranged between two of the preceding rows adjacent thereto.

2. The OLED pixel arrangement structure as claimed in claim 1, wherein the first sub-pixel groups each comprise two first sub-pixels.

3. The OLED pixel arrangement structure as claimed in claim 2, wherein the two first sub-pixels are arranged in a manner of upper-lower, left-right or diagonal positions in the first sub-pixel group.

4. The OLED pixel arrangement structure as claimed in claim 2, wherein the two first sub-pixels in each of the first sub-pixel groups are driven by a driving circuit, or driven by two driving circuits respectively.

5. The OLED pixel arrangement structure as claimed in claim 1, wherein the second sub-pixel groups each comprise two second sub-pixels.

6. The OLED pixel arrangement structure as claimed in claim 1, wherein a distance between adjacent first sub-pixel group and second subpixel group in the n-th row is greater than or equal to a width of a third sub-pixel, and a distance between two adjacent third sub-pixels in the (n+1)th row is greater than or equal to a width of one first sub-pixel group or one second sub-pixel group.

7. The OLED pixel arrangement structure as claimed in claim 1, comprising a number of columns, wherein an m-th column of the number of columns of the OLED pixel arrangement structure comprises an alternating arrangement of multiple ones of the first sub-pixel groups and multiple ones of the second sub-pixel groups at intervals; and an (m+1)th column of the number of columns is one of the number of columns that is next to the m-th column and comprises multiple ones of the third sub-pixels arranged at intervals, wherein a distance between adjacent first sub-pixel group and second sub-pixel group in the m-th column is greater than or equal to a height of a third sub-pixel, and a distance between two adjacent third sub-pixels in the (m+1)th column is greater than or equal to a height of one first sub-pixel group or one second sub-pixel group, and in is a positive integer such that the m-th column is selected as one of the number of columns that has a column located next thereto in a given direction.

8. The OLED pixel arrangement structure as claimed in claim 1, wherein at least one of the first sub-pixel groups, second sub-pixel groups and the third sub-pixels is uniformly distributed in the OLED pixel arrangement structure.

9. The OLED pixel arrangement structure as claimed in claim 1, wherein the third sub-pixels are each a green sub-pixel.

10. A display panel, comprising an organic light emitting diode (OLED) pixel arrangement structure, and the OLED pixel arrangement structure comprising a number of rows of sub-pixels comprising: first sub-pixel groups each of which comprises at least one first sub-pixel, second sub-pixel groups each of which comprises at least one second sub-pixel, and third sub-pixels, at least one of the first and second sub-pixel groups comprising multiple sub-pixels, wherein an n-th row of the number of rows of the OLED pixel arrangement structure comprises alternating arrangement of multiple ones of the first sub-pixel groups and multiple ones of the second sub-pixel groups at intervals; and an (n+1)th row of the number of rows is one of the number of rows that next to the n-th row and comprises multiple ones of third sub-pixels arranged at intervals, and the third sub-pixels are respectively disposed at the intervals between the first sub-pixel groups and the second sub-pixel groups, where n is a positive integer such that the n-th row is selected as one of the number of rows that has a row located next thereto in a predetermined direction, wherein for two adjacent rows of the number of rows, a preceding row in the predetermined direction comprises the first sub-pixel groups and the second sub-pixels alternating each other and a following row that follows the preceding row in the predetermined direction comprises individual ones of the third sub-pixels, such that the individual third sub-pixels are disposed at the intervals between the first sub-pixel groups and the second sub-pixel groups, and wherein each of the preceding rows that comprise the first sub-pixel groups and the second sub-pixels alternating each other is arranged between two of the following rows adjacent thereto; and each of the following rows that comprise individual ones of the third sub-pixels is arranged between two of the preceding rows adjacent thereto.

11. The display panel as claimed in claim 10, wherein the first sub-pixel groups each comprise two first sub-pixels.

12. The display panel as claimed in claim 11, wherein the two first sub-pixels are arranged in a manner of upper-lower, left-right or diagonal positions in the first sub-pixel group.

13. The display panel as claimed in claim 11, wherein the two first sub-pixels in each of the first sub-pixel groups are driven by a driving circuit, or driven by two driving circuits respectively.

14. The display panel as claimed in claim 10, wherein the second sub-pixel groups each comprise two second sub-pixels.

15. The display panel as claimed in claim 10, wherein a distance between adjacent first sub-pixel group and second subpixel group in the n-th row is greater than or equal to a width of a third sub-pixel, and a distance between two adjacent third sub-pixels in the (n+1)th row is greater than or equal to a width of one first sub-pixel group or one second sub-pixel group.

16. The display panel as claimed in claim 10, comprising a number of columns, wherein an m-th column of the number of columns of the OLED pixel arrangement structure comprises an alternating arrangement of multiple ones of the first sub-pixel groups and multiple ones of the second sub-pixel groups at intervals; and an (m+1)th column of the number of columns is one of the number of columns that is next to the m-th column and comprises multiple ones of the third sub-pixels arranged at intervals, wherein a distance between adjacent first sub-pixel group and second sub-pixel group in the m-th column is greater than or equal to a height of a third sub-pixel, and a distance between two adjacent third sub-pixels in the (m+1)th column is greater than or equal to a height of one first sub-pixel group or one second sub-pixel group, and in is a positive integer such that the m-th column is selected as one of the number of columns that has a column located next thereto in a given direction.

17. The display panel as claimed in claim 10, wherein at least one of the first sub-pixel groups, second sub-pixel groups and the third sub pixel sub-pixels is uniformly distributed in the OLED pixel arrangement structure.

18. The display panel as claimed in claim 10, wherein the third sub-pixels are each a green sub-pixel.

* * * * *